(12) United States Patent
Edmunds et al.

(10) Patent No.: US 7,796,389 B2
(45) Date of Patent: Sep. 14, 2010

(54) METHOD AND APPARATUS FOR COOLING ELECTRONICS

(75) Inventors: Howard Ross Edmunds, Roanoke, VA (US); Richard Kenneth McFalls, Boones Mill, VA (US)

(73) Assignee: General Electric Company, Schenectady, NY (US)

( * ) Notice: Subject to any disclaimer, the term of this patent is extended or adjusted under 35 U.S.C. 154(b) by 22 days.

(21) Appl. No.: 12/324,757

(22) Filed: Nov. 26, 2008

(65) Prior Publication Data

US 2010/0128436 A1 May 27, 2010

(51) Int. Cl.
*H05K 7/20* (2006.01)

(52) U.S. Cl. ............ 361/700; 361/679.47; 361/679.52; 361/679.54; 361/699; 361/701; 165/80.4; 165/104.14; 165/104.26; 62/259.2

(58) Field of Classification Search ............ 361/679.46, 361/679.53, 679.54, 699–701, 703–712, 361/715, 719; 257/713–715, 718, 719, 722, 257/723; 165/80.2, 80.3, 80.4, 80.5, 104.14, 165/104.21, 104.25, 104.33, 104.34, 185; 62/259.2, 389; 174/15.1, 16.3, 252
See application file for complete search history.

(56) References Cited

U.S. PATENT DOCUMENTS

| | | | |
|---|---|---|---|
| 4,697,205 A | 9/1987 | Eastman | |
| 4,833,567 A | 5/1989 | Saaski et al. | |
| 4,880,052 A | 11/1989 | Meyer, IV et al. | |
| 6,410,982 B1 * | 6/2002 | Brownell et al. | 257/714 |
| 6,508,301 B2 * | 1/2003 | Marsala | 165/80.4 |
| 6,808,015 B2 * | 10/2004 | Osakabe | 165/104.25 |
| 6,926,072 B2 | 8/2005 | Wert | |
| 7,077,189 B1 * | 7/2006 | Reyzin et al. | 165/80.4 |
| 7,111,394 B2 | 9/2006 | Wert | |
| 7,210,304 B2 * | 5/2007 | Nagashima et al. | 62/259.2 |
| 7,450,386 B2 * | 11/2008 | Silverstein et al. | 361/700 |
| 7,492,594 B2 * | 2/2009 | Pal | 361/699 |
| 7,506,682 B2 * | 3/2009 | Bhatti et al. | 165/104.14 |
| 7,604,040 B2 * | 10/2009 | Ghosh et al. | 165/80.3 |
| 2002/0144802 A1 * | 10/2002 | Jairazbhoy et al. | 165/80.3 |
| 2004/0055322 A1 * | 3/2004 | Monfarad | 62/259.2 |
| 2004/0065111 A1 * | 4/2004 | Monfarad | 62/498 |
| 2004/0079100 A1 * | 4/2004 | Monfarad | 62/259.2 |
| 2005/0173096 A1 * | 8/2005 | Hsu et al. | 165/104.21 |
| 2006/0162898 A1 * | 7/2006 | Reyzin et al. | 165/80.4 |
| 2006/0162903 A1 * | 7/2006 | Bhatti et al. | 165/104.14 |
| 2006/0162904 A1 * | 7/2006 | Bhatti et al. | 165/104.14 |
| 2006/0185828 A1 * | 8/2006 | Takehara et al. | 165/104.26 |
| 2007/0076376 A1 * | 4/2007 | Mongia et al. | 361/700 |
| 2007/0204646 A1 * | 9/2007 | Gagliano | 62/389 |
| 2008/0110594 A1 * | 5/2008 | Martin et al. | 165/80.4 |
| 2009/0140417 A1 * | 6/2009 | Refai-Ahmed | 257/707 |

* cited by examiner

*Primary Examiner*—Michael V Datskovskiy
(74) *Attorney, Agent, or Firm*—Fletcher Yoder

(57) ABSTRACT

Embodiments of the present disclosure provide for methods and devices for improving the heat dissipating properties of a heatsink to provide increased cooling for electronic equipment, such as power converters. In one embodiment, a heatsink includes at least one fluid cooled portion and at least one heat pipe disposed adjacent to the fluid cooled portion. The heat pipe improves the conduction of heat away from heat sources.

20 Claims, 9 Drawing Sheets

METHOD AND APPARATUS FOR COOLING ELECTRONICS

BACKGROUND OF THE INVENTION

The subject matter disclosed herein relates to improved heat dissipation techniques, e.g., a heatsink for electronic devices.

Many types of electronic devices generate substantial amounts of heat. Generally, the amount of heat generated is proportion to the amount of power used by the device. The power handling ability of many electronic devices is limited by the amount of heat the device can effectively dissipate, because excessive heat can damage electronics. Heatsinks are used to increase heat dissipation in many types of electronic equipment, such as power converters, motor drives, processors, power transmission devices, and batteries. Improved methods and devices for dissipating the heat generated by high power-density electronics may increase the power handling capabilities of these devices.

BRIEF DESCRIPTION OF THE INVENTION

Embodiments of the present disclosure provide for methods and devices for improving the heat dissipating properties of a heatsink to provide increased cooling for electronic equipment, such as power converters. In one embodiment, a heatsink includes at least one fluid cooled portion and at least one heat pipe disposed adjacent to the fluid cooled portion. The heat pipe improves the conduction of heat away from heat sources.

BRIEF DESCRIPTION OF THE DRAWINGS

These and other features, aspects, and advantages of the present invention will become better understood when the following detailed description is read with reference to the accompanying drawings in which like characters represent like parts throughout the drawings, wherein.

DETAILED DESCRIPTION OF THE INVENTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present invention, the articles "a," "an," "the," and "said" are intended to mean that there are one or more of the elements. The terms "comprising," "including," and "having" are intended to be inclusive and mean that there may be additional elements other than the listed elements. Any examples of operating parameters and/or environmental conditions are not exclusive of other parameters/conditions of the disclosed embodiments.

Embodiments of the disclosed heat sink include a fluid cooled plate in combination with a heat spreading device that spreads heat laterally across the fluid cooled plate. Spreading heat laterally improves the ability of the heatsink to conduct heat away from heat generating devices, and increases the surface area of heat dissipation. In certain embodiments, the disclosed heatsink includes an internal heat exchanger (e.g., fins and channels) and a vapor chamber and/or heat pipes. The heat exchanger may include rows of fins (e.g., a folded fin configuration) to facilitate heat transfer to a fluid (e.g., liquid or gas) flowing through an interior of the heatsink from an inlet to an outlet. The disclosed heatsink may be a single structure or multiple pieces coupled together to define a closed body about the heat exchanger and vapor chamber and/or heat pipes. The heatsink may include external fins to enable convective heat transfer with or without an external fan. The disclosed heatsink also may include multiple layers of heat exchangers, vapor chambers, heat pipes, and other cooling features (e.g., an alternating arrangement). The improved heatsink provides increased cooling for use in a variety of high power-density applications. For example, embodiments of the disclosed heatsink may be used with a power converter. The disclosed heatsink may be mounted to a single component or multiple components (e.g., chips, memory, processors, etc.).

Figure 1:
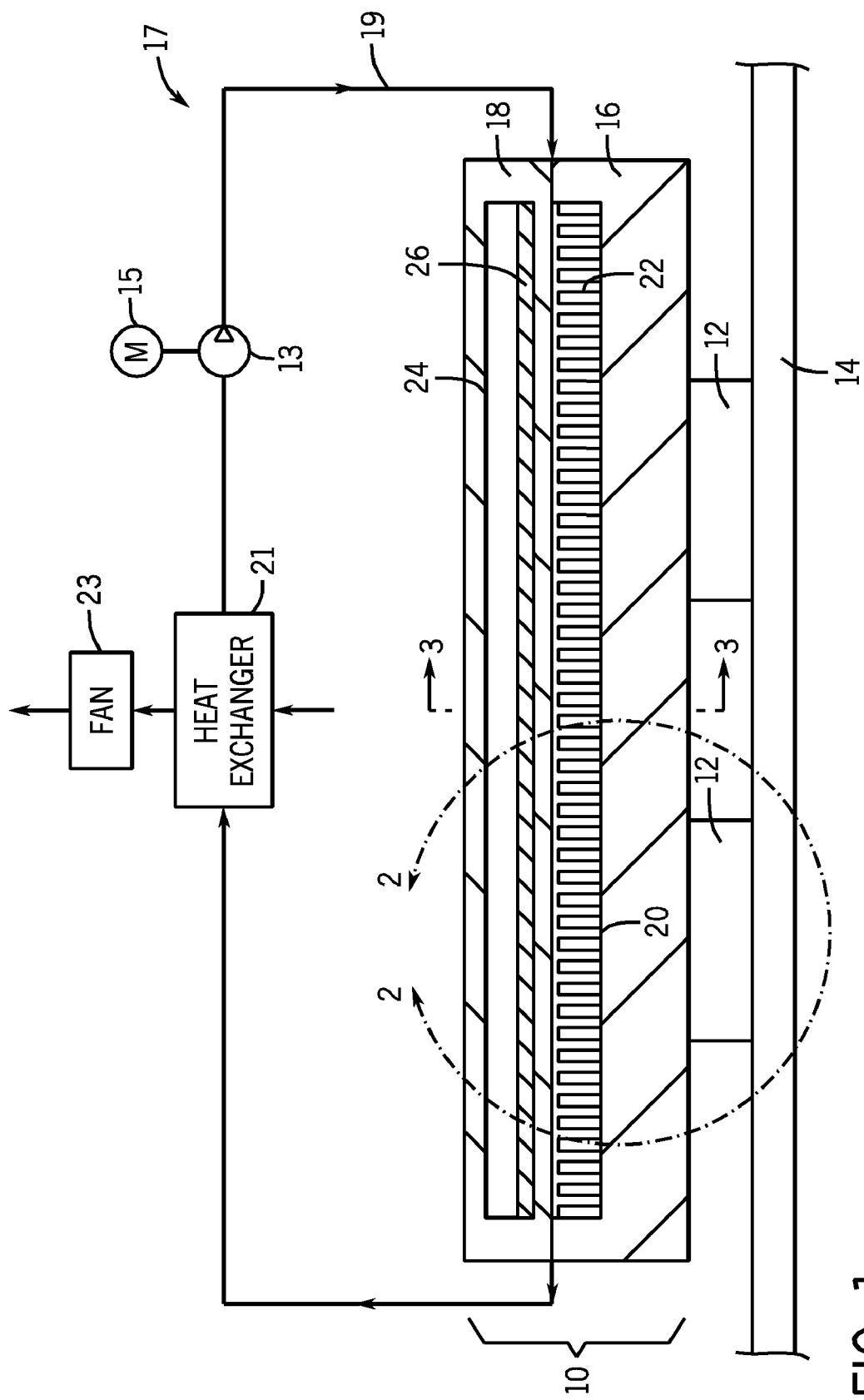
FIG. 1 is a cross-sectional view of an improved heatsink, in accordance with certain embodiments.

FIG. 1 is a cross-sectional view of an improved heatsink 10 in accordance with an embodiment. FIG. 1 shows the heatsink 10 disposed adjacent to one or more heat generating circuits 12 on a circuit board 14. The circuits 12 may be any type of heat generating circuits such as a processors, memory devices, amplifiers, switches, etc. As will be explained further below in relation to FIG. 6, the circuits 12 may be high-power, solid-state switches such as those used in an inverter module. The circuits 12 may interface the heatsink 10 with a layer of thermally conductive material, such as thermal grease. In some embodiments, the heatsink 10 may couple to the circuit board 14 and/or the heat generating circuits 12. For example, in some embodiments, the heatsink 10 may couple to the circuit board 14 via screws, bolts, nap-fit clamps, spring-loaded clamps, or other suitable releasable or fixed couplings. In some embodiments, the circuits 12 may be soldered to the heatsink 10.

The heatsink 10 may include a cooling plate 16 and a heat spreader 18. The cooling plate 16 is a portion of thermally conductive material that draws heat from the circuitry 12. The cooling plate 16 may be made from any suitable thermally conductive material, including thermally conductive plastics, such as polyphenylene sulfide, and metals such as copper and aluminum, and may be approximately 0.25 to 1 inch thick. However, any other material and dimensions may be employed depending on the application and desired cooling capacity. The cooling plate 16 may also include a fluid path 20 for conducting a cooling fluid (e.g., liquid or gas) that draws heat from the cooling plate 16 and transfers the heat to the external environment. For example, in certain embodiments, the cooling fluid may circulate through a coolant loop 17 (e.g., a closed loop), which may include the fluid path 20 inside the heatsink 10 and external tubing 19 passing through an external heat exchanger 21 having a fan 23. In some embodiments, the cooling fluid may enter and exit the fluid path 20 of the heatsink 10 in an open loop, e.g., without re-circulating the same fluid. In some embodiments, the cooling fluid may be driven into circulation by a pump 13 coupled to a motor 15.

In certain embodiments, the heatsink 10 may include an internal heat exchanger 22 disposed inside the fluid path 20 to increase the rate of heat transfer from the cooling plate 16 to the cooling fluid. The heat exchanger 22 may include any suitable arrangement of heat exchanger elements, such as fins. For example, the heat exchanger 22 may be a folded-fin style or bonded-fin style. The heat exchanger 22 may be formed from any suitable material, such as aluminum or copper or a thermally conductive plastic. In some embodiments, the heat exchanger 22 and the fluid cooled plate 16 may be one piece. For example, the heat exchanger 22 and the fluid path 20 may be formed simultaneously by cutting a series of parallel grooves cut into the fluid cooled plate 16. In this example, the plate 16 and heat exchanger 22 are made of the same material. In other embodiments, the fluid path 20 may be formed first, and the heat exchanger 22 may be placed inside the fluid path 20. In this embodiment, the plate 16 and heat exchanger 22 may be made of the same or different materials.

Figure 7:
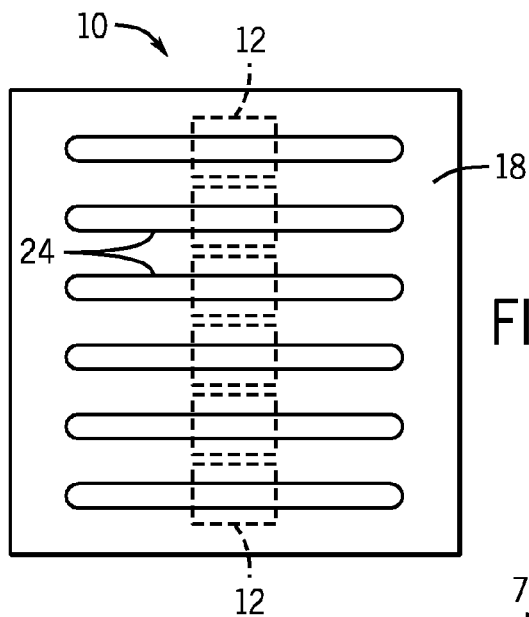
FIGS. 7-9 are cross-sectional, top views of various heat spreaders that may be used with the improved heatsink, in accordance with certain embodiments.
Figure 8:
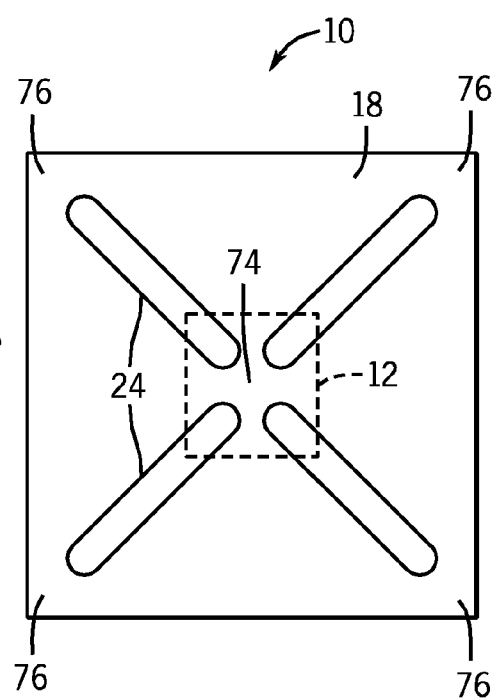
Figure 9:
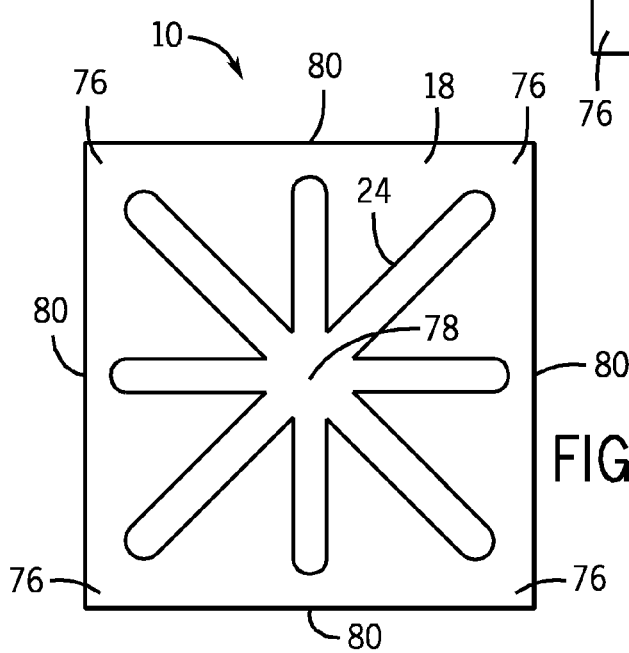

The heat spreader 18 may be disposed above the fluid cooled plate 16 and serves to diffuse heat laterally across the heatsink 10 and away from hot spots. The heat spreader 18 may be formed from any suitable thermally conductive material, such as copper, aluminum, or thermally conductive plastic. In certain embodiments, the heat spreader 18 may include one or more heat pipes and/or vapor chambers 24 configured to transfer heat laterally via evaporative cooling, as will be explained further below, in relation to FIG. 2. The vapor chamber 24 is a type of heat pipe and includes a closed volume that holds a working fluid, such as water, ethanol, acetone, sodium, or mercury. The vapor chamber 24 also includes a wick 26, which may be made from any suitable porous material, such as sintered metal powder. In some embodiments, the heat spreader 18 may include a plurality of separate heat pipes disposed in a parallel or diverging arrangement, as shown in FIGS. 7-9.

The heat spreader 18 may be disposed above the cooling plate 16 in any fashion that forms a strong thermal bond between the cooling plate 16 and the heat spreader 18. For example, in the embodiment shown, the cooling plate 16 and the heat spreader 18 are two separately formed pieces that are joined together such that the bottom of the heat spreader 18 encloses the fluid path 20. The cooling plate 16 and the heat spreader 18 may be joined by any suitable coupling, such as by welding, soldering, brazing, mechanical fasteners, or adhesives. In some embodiments, the cooling plate 16 and the heat spreader may be formed substantially from a single block of the same material.

Figure 2:
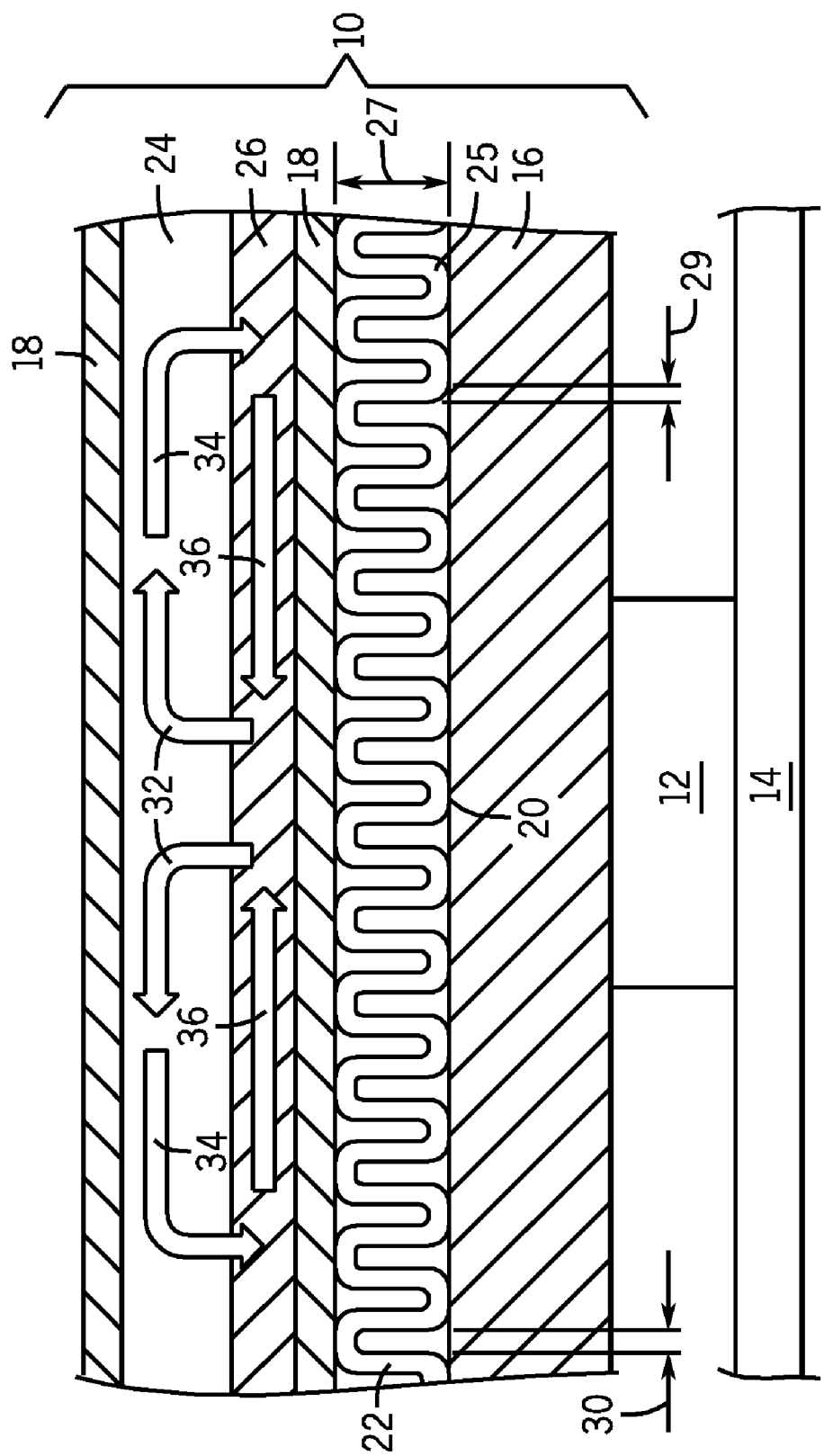
FIG. 2 is a partial, cross-sectional view of the heatsink of FIG. 1, taken within line 2-2, in accordance with certain embodiments.

FIG. 2 is a partial, cross-sectional view of the heatsink of FIG. 1 taken within line 2-2, illustrating heat-spreading properties of the heat spreader 18 in accordance with certain embodiments. The partial view also provides a more detailed view of the heat exchanger 22, which, in the embodiment shown in FIG. 2, is a folded fin type. The folded fin heat exchanger may include a sheet of material with an alternating arrangement of folds that define an alternating U-shaped pattern. In certain embodiments, the heat exchanger 22 includes fins 25 that are approximately 2 millimeters high 27, 0.5 millimeters thick 29 and form a channel 30 that is approximately 0.25 millimeters wide. However, the fins 25 may have any other configuration and dimensions depending on the application and desired cooling capacity. During operation, the circuit 12 may produce significant heat, forming a hot spot in the cooling plate 16 above the circuit 12. The cooling plate 16 conducts the heat from the circuit 12 to the fluid path 20. The transfer of heat from the cooling plate 16 to the fluid in the channels 30 is aided by the fact that the heat spreads out laterally across the plate 16 as it travels from the circuit 12 to the fluid path 20, increasing the surface area over which the heat is spread. Meanwhile, the cooling fluid flowing through the channels 30 (into the page) removes heat from cooling plate 16, increasing the rate of heat transfer from the circuit 12.

The heat spreader 18 also facilitates heat distribution and dissipation via the thermally conductive material and the vapor chamber 24. For example, the heat spreader 18 conducts heat through the metal and transfers heat via evaporation and condensation in the vapor chamber 24 to provide a more uniform distribution of heat. In turn, the more uniform heat distribution improves external cooling (e.g., natural or forced air convection) and internal fluid cooling (e.g., fins 25 into fluid and out of heatsink 10). The base of the heat spreader 18 may be hotter directly above the heat sources, such as the circuit 12. As such, the fluid within hot spots of the wick 26 may evaporate as indicated by arrow 32. The vapor may then travel to cooler areas of the vapor chamber 24 and condense back into the wick 26, as indicated by arrow 34. The fluid may then be carried by capillary action back to the hot spot, as indicated by arrow 36, where the fluid is evaporated again, and the cycle is repeated. To control the temperature at which the fluid in the vapor chamber 18 vaporizes and condenses, the pressure inside the vapor chamber 18 may be adjusted. For example, if the fluid is water, then the pressure inside the vapor chamber may be less than atmospheric pressure, allowing the water to vaporize at less than the normal boiling point of water. Additionally, the heat spreader 18 may work more effectively if the wick 26 is located at the bottom of the vapor chamber 24 so that the convection process may be assisted by gravity, which tends to urge the condensed water back into the wick 26 if the vapor chamber is on the bottom. However, the wick 26 may be disposed on the top, the bottom, or both, in various embodiments of the heatsink 10. As will be explained further below, in relation to FIG. 4, the heatsink 10 may be assembled in such a way as to be less dependent on physical orientation.

With the heat spreader shown in FIG. 2, heat is conducted laterally over the entire surface of the heatsink. Some of the heat may be conducted to the top of the heat spreader 18, where the heat then passes into the external environment. Some of the heat may also be conducted back to the fluid path 20. In both cases, the heat is spread from hotter regions of the heatsink 10 to cooler regions, and the effective heat transfer surface area is increased. The overall effect is to provide increased cooling in hotter regions of the heatsink 10, allowing heat to be removed from the circuit 12 more effectively.

Figure 3:
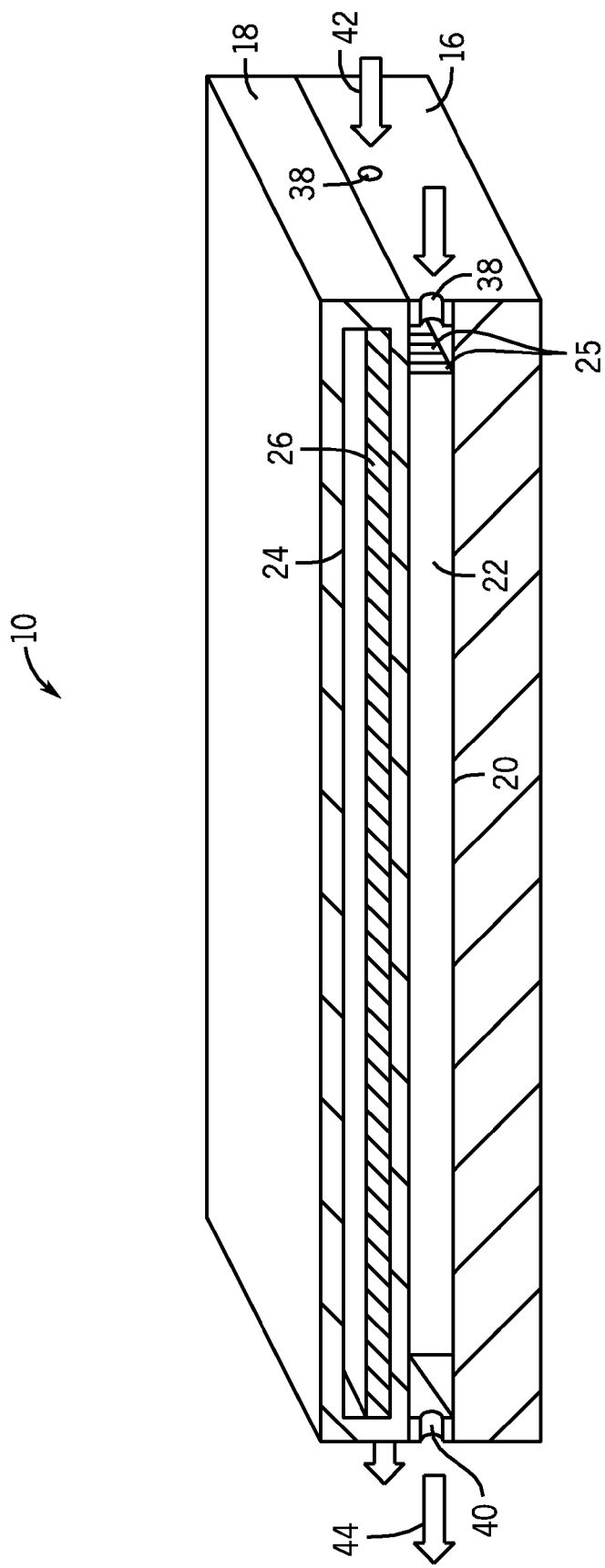
FIG. 3 is a perspective, cut-away view of the improved heatsink of FIG. 1, taken along line 3-3, in accordance with certain embodiments.

FIG. 3 is a perspective, cut-away view of the heatsink 10 taken along line 3-3, illustrating a lengthwise view of the heatsink 10, in accordance with certain embodiments. As shown in FIG. 3, the heat spreader 18 includes the vapor chamber 24 that is continuous along the length of the heatsink, forming a flat rectangular cavity. In other embodiments that will be described further below in relation to FIGS. 7-9, the heat spreader 18 may include a plurality of vapor chambers 24, or heat pipes, and the vapor chambers 24 may be of various shapes and dimensions.

As is also shown in FIG. 3, the fluid path 20 may be fluidly coupled to an external source of cooling fluid via one or more fluid inlets 38 and one or more fluid outlets 40. The inlets 38 and outlets 40 may be configured to receive a fluid conduit such as a pipe or tube. For example, inlets 38 and outlets 40 may be threaded to accept a conduit adapter. The fins 25 of the heat exchanger 22 run along the length of the fluid path 20 (e.g., in spaced relation parallel to the page) between the inlets 38 and outlets 40. Cooling fluid enters the cooling plate 16 via the inlets 38 as indicated by arrows 42 and travels between the fins 25 of the heat exchanger 22 drawing heat from the heat sink 10 along the way. The heated fluid then exits the fluid path 20 through the outlets 40 as indicated by arrows 44. The cooling fluid may then be cooled and recirculated back into the heatsink 10 via the inlets 38. Accordingly, the heatsink 10 may be coupled to a pump 13 and an external heat exchanger 21 such as a radiator. The cooling fluid may include water, ethylene glycol, diethylene glycol, propylene glycol, or any other suitable coolant or combination thereof. In some embodiments, the fluid path 20 may also include one or more internal structures, such as baffles, for directing the cooling fluid to flow evenly through the fluid path 20. Additionally, in some embodiments, the fluid path 20 may follow a winding path through the cooling plate 16.

As mentioned above, some embodiments of the heatsink 10 may be more effective when oriented such that the wick 26 is at the base of the vapor chamber 24. Accordingly, the heatsink 10 may include a wick 26 along upper and lower regions of the vapor chamber 24 to make the performance of the heatsink 10 less dependent on physical orientation. For example, some embodiments of the heatsink 10 may include two heat spreaders 18 with oppositely oriented wicks 26, as shown in FIG. 4.

Figure 4:
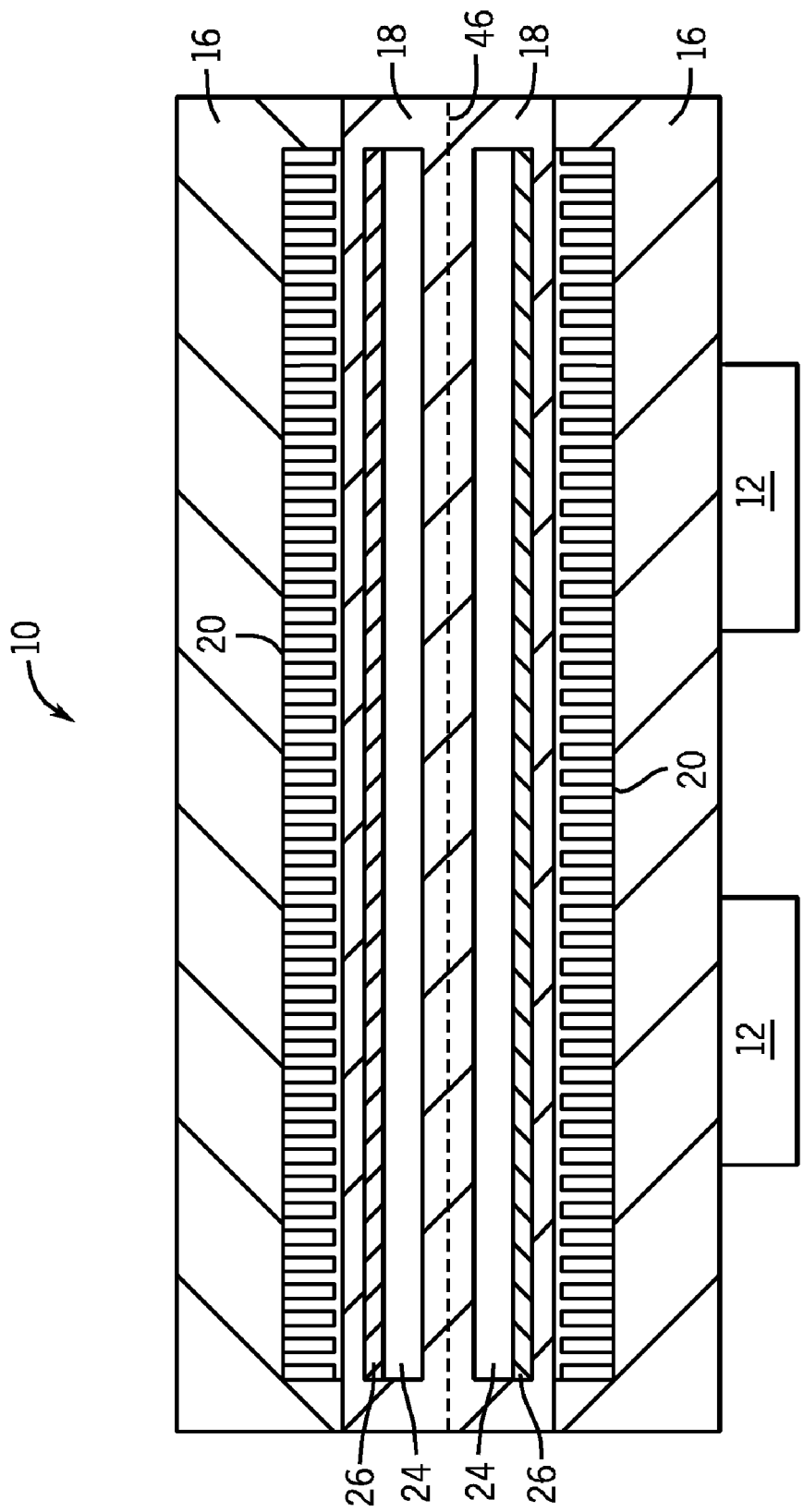
FIGS. 4 and 5 are cross-sectional views of embodiments of heatsinks.

FIG. 4 is a cross sectional view of a double-sided heatsink, in accordance with certain embodiments. As shown in FIG. 4, the heatsink 10 includes two cooling plates 16 and two vapor chambers 18 stacked vertically and forming a mirror image of each other about a centerline 46. In some embodiments, both fluid paths 20 may be communicatively coupled to the same external tubing 19 and/or cooling fluid inlet 38 and outlet 40, so that cooling fluid passes through both fluid paths 20. In other embodiments, the heatsink 10 may include a valve or regulator for biasing the cooling fluid into one fluid path 20 over another. For example, a valve may be used to provide a lesser flow rate in the top fluid path 20 versus the bottom fluid path 20, which will normally be closer to the circuits 12. The valve may be a manual valve, a gravity based valve, an automated valve coupled to a controller, or any other suitable flow control. The gravity based valve may sense the orientation of the heatsink 10 and provide greater flow to the bottom fluid path 20. The vapor chamber 18 that is closest to the circuits 12 may be oriented so that the wick 26 is located at the bottom of the vapor chamber 18. In other words, the heatsink 10 is flipped upside down, then, the bottom wick 26 may always remain on the bottom of its respective vapor chamber 18 as long as the circuits 12 remain below the heatsink 10. In this way, the mirror-like configuration of the heatsink 10 enables the vapor chamber 24 to be effective in both right side up and upside down configurations.

Figure 5:
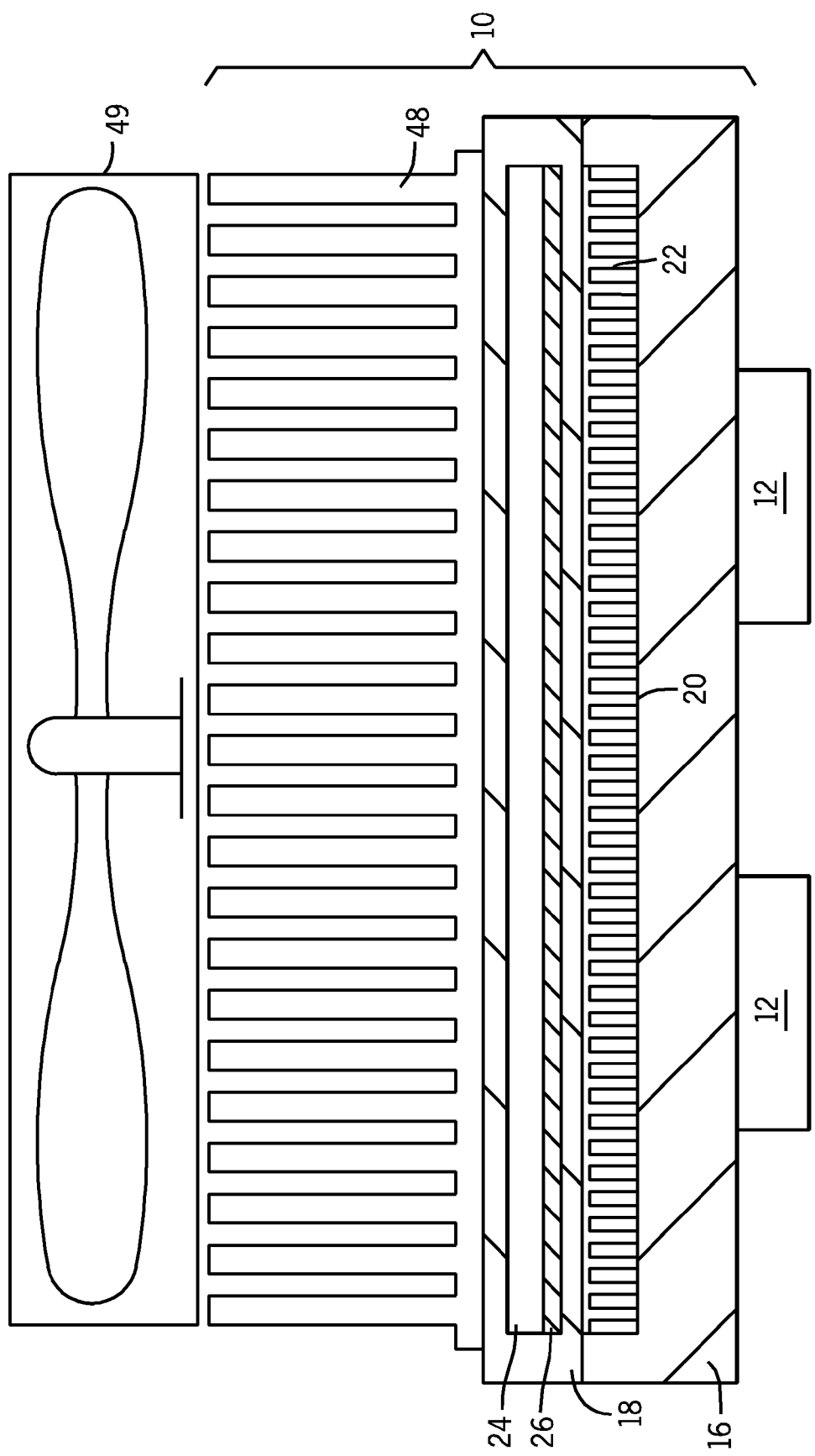

FIG. 5 is a cross sectional view of a heatsink with external fins 48 and an external fan 49, in accordance with certain embodiments. It will be appreciated that the heatsink 10 may conduct some heat through the top of the heat spreader 18. To efficiently dissipate this heat into the external environment, the heatsink 10 may include external fins 48. In some embodiments, the external fins 48 may be air cooled via natural convection or forced convection via the fan 49. The external fins 48 may be disposed on any of the illustrated embodiments. The external fins 48 may include parallel pin-type members, parallel plate-type members, diverging plate-type members, or any other suitable geometry or configuration.

Figure 6:
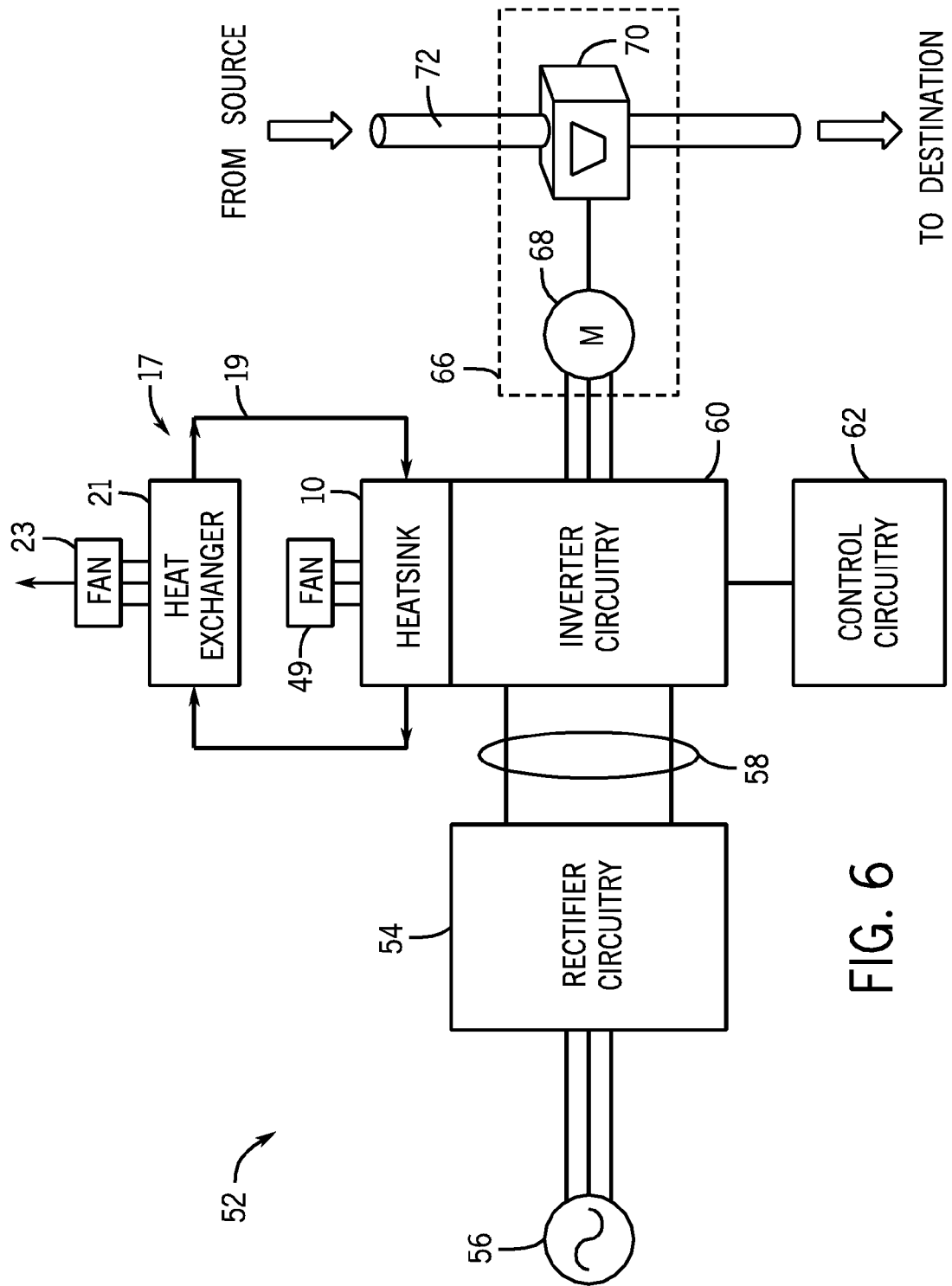
FIG. 6 is a block diagram of an exemplary power converter system that employs an improved heatsink, in accordance with certain embodiments.

As mentioned above, the improved heatsink disclosed herein may improve the power handling characteristics of certain circuits such as insulated-gate, bipolar transistors (IGBTs) and integrated-gate, commutated thyristors (IGCTs), both of which may be used in power converters. FIG. 6 is a block diagram of an exemplary power converter system 52 that employs an improved heatsink 10, in accordance with certain embodiments. The power converter system 52 may include a rectifier circuitry 54 coupled to an alternating current (AC) power source 56. The rectifier circuitry 54 receives AC power from the AC power source and generates a direct current (DC) voltage on the DC bus 58. An inverter circuitry 60, powered by the DC bus voltage, generates an output power waveform at a particular frequency. A typical inverter circuitry may include one or more insulated-gate, bipolar transistors (IGBTs) that are switched rapidly on and off to generate the output power waveform. The inverter circuitry 60 may be coupled to a control circuitry 62 that may receive a user input and provides drive signals that enable the IGBTs to generate the output waveform. In some embodiments, the inverter circuitry 60 is driven using pulse width modulation. Rapid switching of the IGBTs may tend to generate substantial amounts of heat in the IGBT. The power handling capability of the IGBTs is often limited by the ability of the IGBTs to dissipate this heat. To keep the temperature of the inverter circuitry within an acceptable range, the inverter circuitry may be coupled to the improved heatsink 10.

The output power generated by the inverter circuitry 60 is then delivered to a load 66. Because the improved heatsink 10 is able to draw high levels of heat from the inverter circuitry 60, the output power from inverter circuitry may be increased, allowing the inverter circuitry 60 to be used in a wider range of high power applications. For example, the load 66 may include a high power motor 68 that drives a compressor 70 coupled to a natural gas pipeline 72. In other embodiments, the motor 68 may drive a pump coupled to an oil pipeline. In yet other embodiments, the motor 68 may provide the motive force for an electric vehicle, an electrical generator, industrial equipment, or any other device. Furthermore, the heatsink 10 may also be coupled to a wide variety of other components, such as computer processors, motherboards, batteries, power transmission devices, or any other component that may benefit from high levels of cooling. For example, the improved heatsink 10 may be coupled to an electrical generator, such as a wind turbine, that provides power to an electrical distribution system.

In addition to the rectangular vapor chamber depicted in FIGS. 1-5, a heat spreader in accordance with embodiments of the present invention may include vapor chambers and heat pipes of various shapes and dimensions. FIGS. 7-9 depict several exemplary heat spreaders 18, in accordance with embodiments of the present invention. FIG. 7, for example, depicts a heat sink 10 with a heat spreader 18 that includes a plurality of discrete, linear vapor chambers 24 (e.g., heat pipes). As shown in FIG. 7, the vapor chambers 24 may be positioned in parallel rows and may be aligned with specific heat producing circuits 12 adjacent to the heat sink 10. In other embodiments, the vapor chambers 24 may be positioned irrespective of the circuitry 12.

FIG. 8 depicts a heat sink 10 with a heat spreader 18 that includes a plurality of discrete, radial vapor chambers 24. As shown in FIG. 8, the vapor chambers 24 (e.g., heat pipes) may radiate outward from a central position 74 of the heatsink 10 to the four corners 76 of the heat spreader 18. In other words, the vapor chambers 24 diverge from the central position 74. Additionally, the heat producing circuitry 12 may be located at the center of the heatsink 10. In certain embodiments, the heat spreader 18 may include 2, 3, 4, 5, 6, 7, 8, 9, 10, or more diverging vapor chambers 24.

FIG. 9 depicts a heatsink 10 with a heat spreader 18 that includes a plurality of radial vapor chambers 24 that are joined at a central location 78 and radiate outward to the four corners 76 and four sides 80 of the heatsink 10. Embodiments of the present invention may include many other heat spreader 18 configurations. For example, a heat spreader in accordance with present embodiments may be round, triangular, V-shaped, or substantially any other shape as desirable to transfer heat away from heat producing circuitry.

Figure 10:
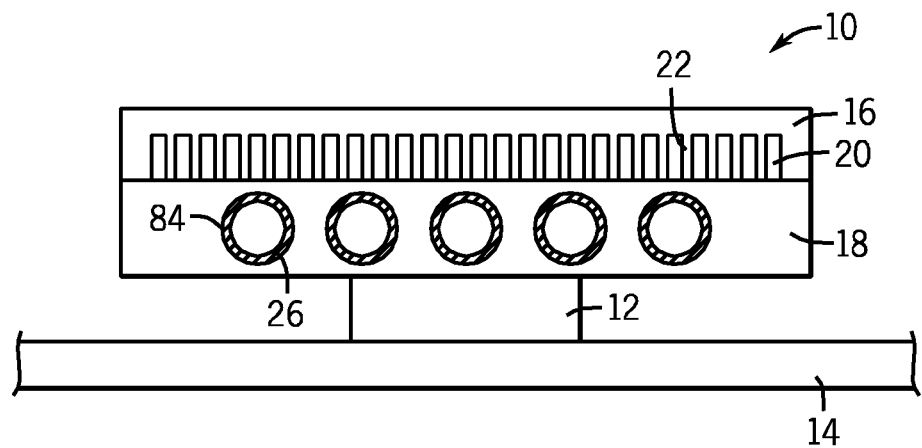
FIGS. 10-13 depict alternative embodiments of heatsinks.

Various other heatsink arrangements that combine one or more heat pipes and one or more fluid channels are also possible. For example, FIGS. 10-13 depict several alternative heatsinks 10 in accordance with embodiments of the present technique. As in previously described embodiments, FIG. 10 depicts an embodiment wherein the heatsink 10 includes a cooling plate 16 and a heat spreader 18. In this embodiment, however, the heat spreader 18 includes a plurality of cylindrical heat pipes 84 disposed between the fluid path 20 and the heat source, circuit 12. The heat pipes 84 may include sealed cylindrical cavities with a wick 26 disposed on the inside surface of the cavity and a working fluid inside the cavity. In this embodiment, the heat from the circuit 12 is first diffused laterally by the heat spreader 18 before passing into the fluid channel 20. Additionally, the fluid channel 20 is formed by machining the fins of the heat exchanger 22 directly in the fluid cooled plate 16.

Figure 11:
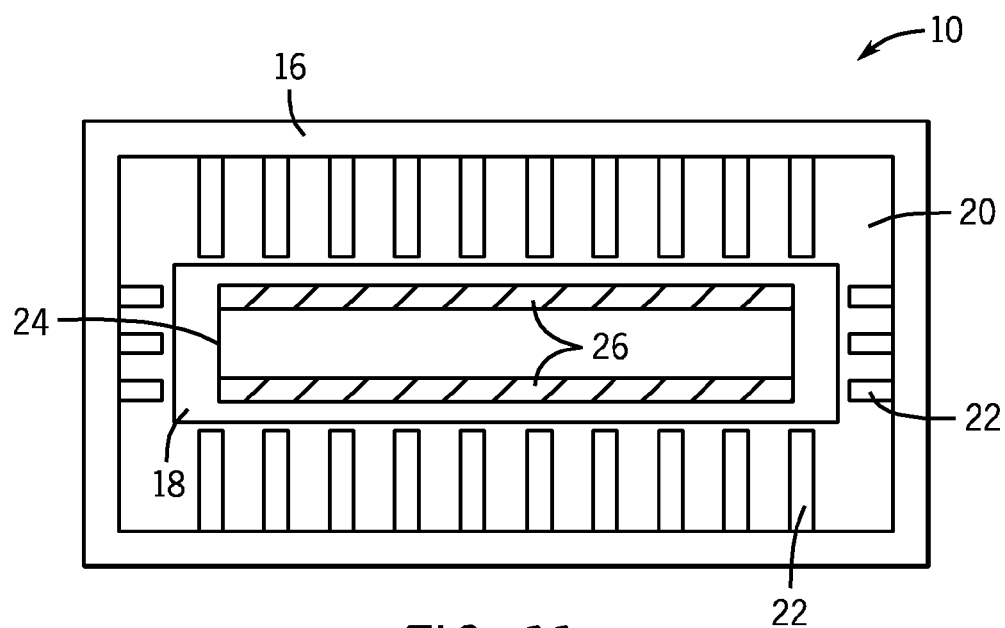

FIG. 11 depicts an embodiment wherein the heatsink 10 includes a heat spreader 18 is disposed inside of and is surrounded by the fluid channel 20. In this embodiment, the heat spreader includes a flat rectangular vapor chamber 24 with wicks 26 disposed on the top and bottom surfaces of the cavity and filled with a working fluid. The fluid channel may include fins 22, which may be bonded to the inside wall of the cooling plate 16. The heat spreader 18 may be positioned within the fluid channel 20 by the fins 22, or alternatively, the heat spreader 18 may be positioned using centering pins. In this embodiment, the heat spreader 18 diffuses heat more evenly throughout the fluid in the fluid channel 20.

Figure 12:
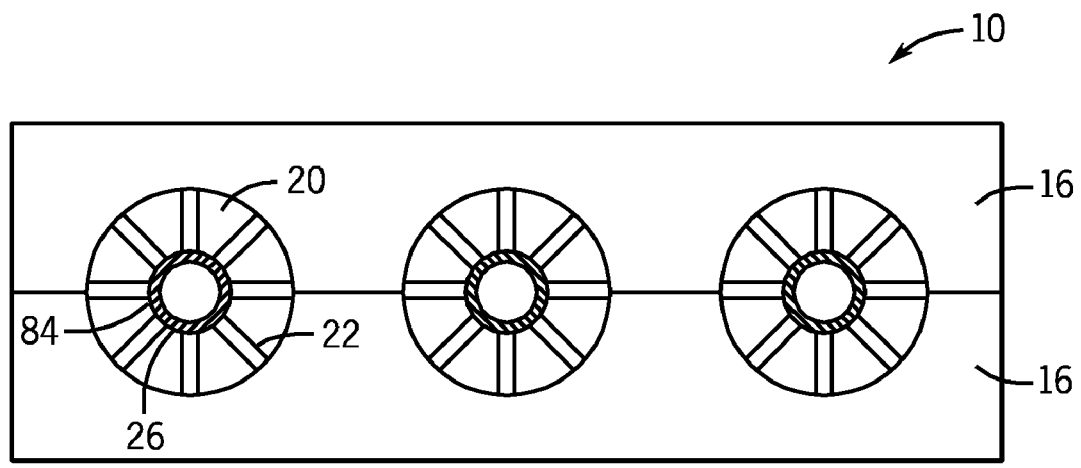

FIG. 12 depicts an embodiment wherein the heatsink 10 includes a cooling plate 16 with one or more cylindrical fluid channels 20 and one or more cylindrical heat pipes 84 disposed inside of the fluid channels 20. The fluid channels 20 may include fins 22 which increase the heat transfer from the fluid channel 20 to the cooling plate 16. The fins 22 may also position the heat pipe 84 within the fluid channel 20. In some embodiments, the heat pipes 84 may also be held in place by centering pins.

Figure 13:
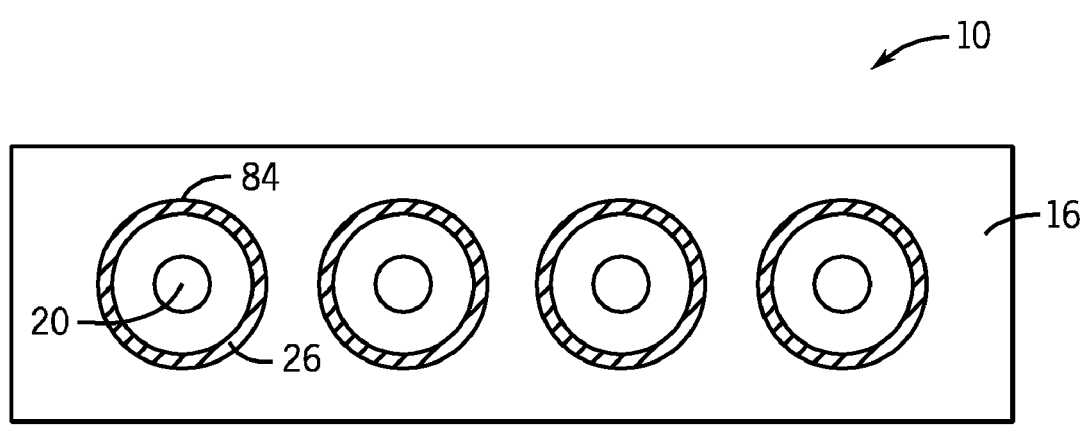

FIG. 13 depicts an embodiment wherein the heatsink 10 includes a cooling plate 16 with one or more cylindrical heat pipes 84 and one or more cylindrical fluid channels 20 disposed inside of the heat pipes 84. In some embodiments, the fluid channels 20 may also be held in place by centering pins.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A system, comprising:
 a heat sink comprising:
  a vapor chamber disposed in the heat sink, wherein the vapor chamber comprises a working fluid disposed inside a closed volume, and the working fluid is configured to circulate within the closed volume by evaporating at a first region and condensing at a second region; and
  a fluid path disposed in the heat sink, wherein the fluid path comprises a fluid inlet, a fluid outlet, and a fluid chamber between the fluid inlet and the fluid outlet;
  a thermally conductive substrate having the vapor chamber inside of the fluid path;
  an external fluid path coupled to the fluid inlet and the fluid outlet to define a closed loop for circulation of a coolant; and
  an external heat exchanger coupled to the external fluid path outside of the heat sink.

2. The system of claim 1, comprising a pump coupled to the external fluid path.

3. The system of claim 1, comprising an internal heat exchanger disposed inside the fluid chamber.

4. The system of claim 3, wherein the internal heat exchanger comprises a folded-fin type heat exchanger.

5. The system of claim 1, comprising an electronic component mounted to the heat sink.

6. The system of claim 1, comprising a power converter module having a rectifier circuit and an inverter module, wherein the heat sink is coupled to the inverter module.

7. A heat sink, comprising:
 a first substrate portion comprising a vapor chamber, wherein the vapor chamber comprises a plurality of diverging heat pipes;
 a second substrate portion comprising a fluid path having a fluid inlet, a fluid outlet, and a fluid chamber between the fluid inlet and the fluid outlet; and
 an internal heat exchanger disposed inside the fluid chamber.

8. The heat sink of claim 7, wherein the internal heat exchanger comprises a folded fin heat exchanger having an alternating arrangement of folds that define an alternating U-shaped pattern.

9. The heat sink of claim 7, wherein the second substrate portion is a one-piece structure including a plurality of fins of the internal heat exchanger.

10. The heat sink of claim 7, comprising a mounting surface configured to dissipate heat from a component, wherein the fluid path is above the mounting surface, and the vapor chamber is above the fluid path.

11. The heat sink of claim 7, wherein the vapor chamber and the fluid path are arranged one inside another.

12. The heat sink of claim 7, comprising internal fins inside the fluid chamber and external fins disposed outside of the first and/or second substrate portions.

13. A motor drive, comprising:
 rectifier circuitry configured to receive alternating current power from a power source and provide direct current power to a power bus;
 inverter circuitry configured to receive power from the power bus and generate an output power waveform; and
 a heatsink thermally coupled to the inverter circuitry, comprising:

a vapor chamber disposed in the heat sink, wherein the vapor chamber comprises a working fluid disposed inside a closed volume, and the working fluid is configured to circulate within the closed volume by evaporating at a first region and condensing at a second region; and a fluid path disposed in the heat sink, wherein the fluid path comprises a fluid inlet, a fluid outlet, and a fluid chamber between the fluid inlet and the fluid outlet, wherein the vapor chamber and the fluid path are arranged one inside another.

14. The motor drive of claim 13, wherein the heatsink comprises an internal folded-fin type heat exchanger disposed inside the fluid path.

15. The motor drive of claim 13, comprising an external fluid path coupled to the fluid inlet and the fluid outlet to define a closed loop for circulation of a coolant and an external heat exchanger coupled to the external fluid path outside of the heat sink.

16. A system, comprising:
 a heat sink comprising:
  a vapor chamber disposed in the heat sink, wherein the vapor chamber comprises a working fluid disposed inside a closed volume, and the working fluid is configured to circulate within the closed volume by evaporating at a first region and condensing at a second region; and
  a fluid path disposed in the heat sink, wherein the fluid path comprises a fluid inlet, a fluid outlet, and a fluid chamber between the fluid inlet and the fluid outlet;
 thermally conductive substrate having the fluid path inside of the vapor chamber;
 an external fluid path coupled to the fluid inlet and the fluid outlet to define a closed loop for circulation of a coolant; and
 an external heat exchanger coupled to the external fluid path outside of the heat sink.

17. The system of claim 16, comprising an electronic component mounted to the heat sink.

18. A heat sink, comprising:
 a first substrate portion comprising a vapor chamber;
 a second substrate portion comprising a fluid path having a fluid inlet, a fluid outlet, and a fluid chamber between the fluid inlet and the fluid outlet; and
 an internal heat exchanger disposed inside the fluid chamber;
 wherein the vapor chamber and the fluid path are arranged one inside another.

19. The heat sink of claim 18, wherein the vapor chamber is arranged inside the fluid path.

20. The heat sink of claim 18, wherein the fluid path is arranged inside the vapor chamber.

* * * * *